United States Patent
Ikonomov et al.

(10) Patent No.: US 10,788,637 B2
(45) Date of Patent: Sep. 29, 2020

(54) APPARATUS, SYSTEM, AND METHOD FOR DISSIPATING HEAT EMITTED BY INDIVIDUAL COMMUNICATION MODULES VIA GANGED HEAT EXCHANGERS

(71) Applicant: Juniper Networks, Inc., Sunnyvale, CA (US)

(72) Inventors: Nikola Ikonomov, Millbrae, CA (US); Christopher Otte, Hollis, NH (US); Attila I. Aranyosi, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 16/231,038

(22) Filed: Dec. 21, 2018

(65) Prior Publication Data

US 2020/0205312 A1 Jun. 25, 2020

(51) Int. Cl.
*G02B 6/42* (2006.01)
*H05K 7/20* (2006.01)
*G02B 6/43* (2006.01)

(52) U.S. Cl.
CPC ............ *G02B 6/4269* (2013.01); *G02B 6/43* (2013.01); *H05K 7/2049* (2013.01); *H05K 7/20336* (2013.01)

(58) Field of Classification Search
CPC ...................................... G02B 6/4268–6/4269
See application file for complete search history.

(56) References Cited

U.S. PATENT DOCUMENTS

| | | | | |
|---|---|---|---|---|
| 6,062,302 A | * | 5/2000 | Davis | F28D 15/02 165/104.26 |
| 8,449,203 B2 | * | 5/2013 | Downs | G02B 6/4269 361/707 |
| 8,829,326 B2 | * | 9/2014 | Dell | H01L 35/30 136/201 |
| 9,547,141 B2 | * | 1/2017 | Wu | G02B 6/4269 |
| 9,590,160 B2 | * | 3/2017 | Dell | H01L 35/30 |
| 9,846,287 B2 | * | 12/2017 | Mack | F28D 15/0275 |
| 9,910,231 B2 | * | 3/2018 | Kelty | G02B 6/4269 |
| 10,091,911 B2 | * | 10/2018 | Kelty | H05K 7/20672 |
| 10,114,182 B2 | * | 10/2018 | Zbinden | G02B 6/4268 |
| 10,121,727 B1 | * | 11/2018 | Lucas | H01L 23/40 |
| 10,241,285 B2 | * | 3/2019 | Mack | F28D 15/0275 |
| 10,310,198 B1 | * | 6/2019 | Yatskov | G02B 6/4269 |
| 10,321,607 B2 | * | 6/2019 | Ito | G02B 6/42 |
| 10,368,464 B2 | * | 7/2019 | Chen | |
| 2014/0160679 A1 | * | 6/2014 | Kelty | H05K 7/20672 361/700 |
| 2015/0354901 A1 | * | 12/2015 | Moore | H01L 23/427 165/104.21 |
| 2019/0215989 A1 | * | 7/2019 | Su | G02B 27/0012 |

* cited by examiner

*Primary Examiner* — Robert J Hoffberg
(74) *Attorney, Agent, or Firm* — FisherBroyles, LLP

(57) ABSTRACT

The disclosed apparatus may include (1) a plurality of individual heatsink bases designed to interface with a plurality of removable communication modules installed on a telecommunications device, (2) a plurality of heat pipes that are thermally coupled to the individual heatsink bases, and (3) a ganged heat exchanger that is (A) mechanically coupled to the telecommunications device and (B) thermally coupled to the heat pipes. Various other apparatuses, systems, and methods are also disclosed.

15 Claims, 8 Drawing Sheets

APPARATUS, SYSTEM, AND METHOD FOR DISSIPATING HEAT EMITTED BY INDIVIDUAL COMMUNICATION MODULES VIA GANGED HEAT EXCHANGERS

Communication modules are often used to facilitate the flow of traffic in telecommunications devices. For example, a router may include line cards that house optical transceivers. In this example, the optical transceivers housed by these line cards may generate and/or emit heat as they forward traffic from one device to another. Unfortunately, if the operating temperature of an optical transceiver exceeds a certain threshold, the optical transceiver may experience a failure and/or be unable to perform at an optimal level.

To transfer heat away from the optical transceiver, the manufacturer of the router may apply heatsinks to the optical transceiver. In this example, the heatsinks may be thermally isolated from one another. As a result, heat absorbed from one optical transceiver may be limited to the heatsink applied to that optical transceiver, as opposed to being dispersed and/or dissipated throughout other heatsinks neighboring the one applied to that optical transceiver.

In some situations, these isolated heatsinks may be able to disperse and/or dissipate enough heat to enable the optimal transceivers to function properly. However, in other situations, these isolated heatsinks may be unable to transfer away enough heat from the optical transceivers, thus potentially resulting in impaired performance or even a failure. For example, isolated heatsinks may be applied to various 100-gigabit optical transceivers installed in one of the line cards. In this example, a 400-gigabit optical transceiver may replace one of those 100-gigabit optical transceivers within the line card.

Unfortunately, the 400-gigabit optical transceiver may generate and/or emit much more heat than the replaced 100-gigabit optical transceiver. Accordingly, while it may have been able to dissipate enough heat for the replaced 100-gigabit optical transceiver, the isolated heatsink applied to the 400-gigabit optical transceiver may now be insufficient. The instant disclosure, therefore, identifies and addresses a need for additional and improved apparatuses, systems, and methods for dissipating heat emitted by individual communication modules via ganged heat exchangers.

SUMMARY

As will be described in greater detail below, the instant disclosure generally relates to apparatuses, systems, and methods for dissipating heat emitted by individual communication modules via ganged heat exchangers. In one example, an apparatus for accomplishing such a task may include (1) a plurality of individual heatsink bases designed to interface with a plurality of removable communication modules installed on a telecommunications device, (2) a plurality of heat pipes that are thermally coupled to the individual heatsink bases, and (3) a ganged heat exchanger that is (A) mechanically coupled to the telecommunications device and (B) thermally coupled to the heat pipes.

Similarly, a telecommunications device incorporating the above-described apparatus may include (1) a plurality of individual heatsink bases designed to interface with a plurality of removable communication modules installed on the telecommunications device, (2) a plurality of heat pipes that are thermally coupled to the individual heatsink bases, and (3) a ganged heat exchanger that is (A) mechanically coupled to the telecommunications device and (B) thermally coupled to the heat pipes.

A corresponding method may include (1) thermally coupling a plurality of heat pipes to a plurality of heatsink bases designed to interface with a plurality of removable communication modules installed on a telecommunications device, (2) thermally coupling a ganged heat exchanger to the plurality of heat pipes, and (3) mechanically coupling the ganged heat exchanger to the telecommunications device.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
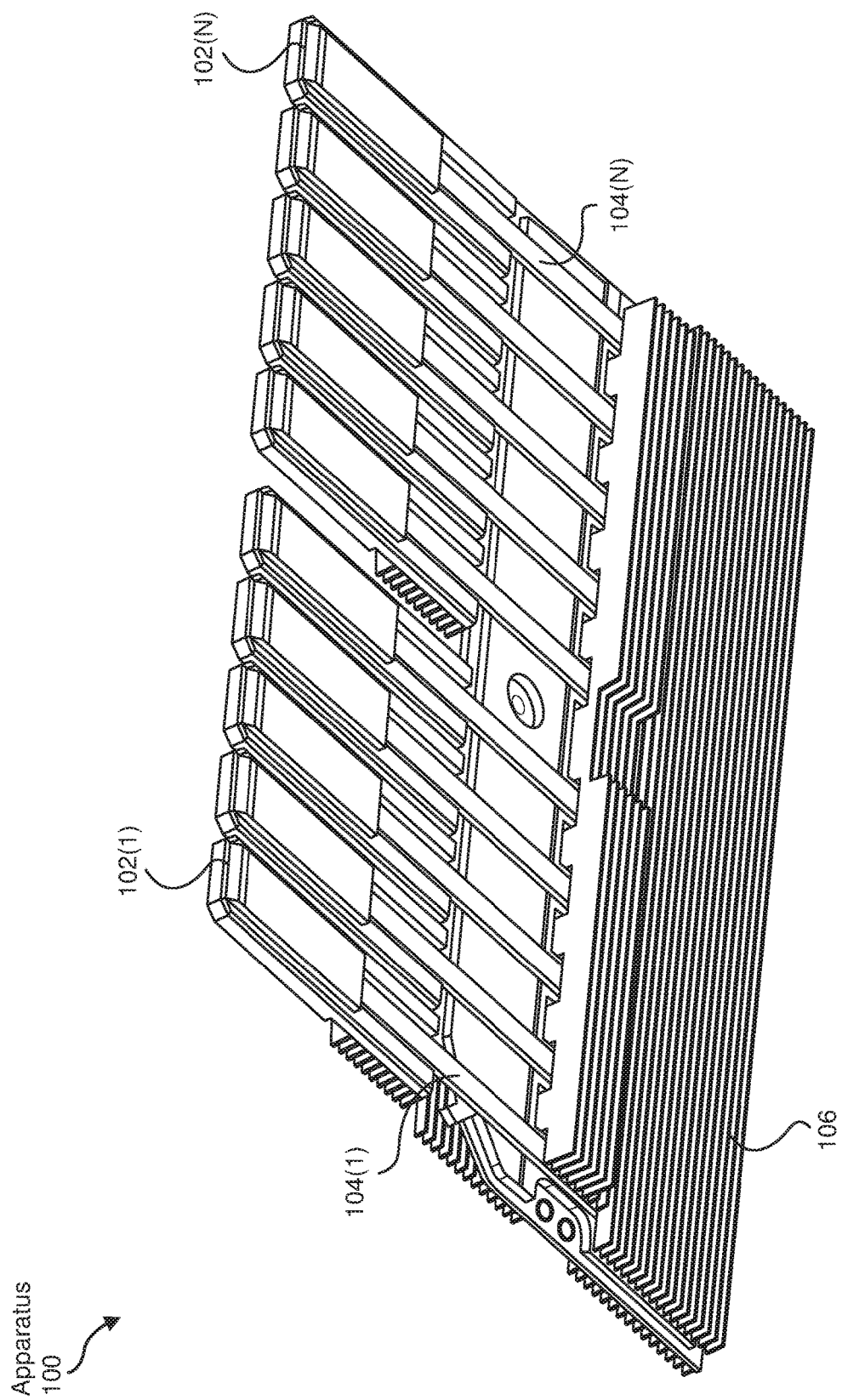
FIG. 1 is an illustration of an exemplary apparatus for dissipating heat emitted by individual communication modules via ganged heat exchangers.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for dissipating heat emitted by individual communication modules via ganged heat exchangers. As will be explained in greater detail below, embodiments of the instant disclosure may enable varied configurations of individual communication modules (such as optical transceivers) to be installed in line cards of telecommunications devices. For example, a ganged heat exchanger may be thermally coupled to multiple flexible heat pipes. In this example, the flexible heat pipes may be thermally coupled to individual heatsink bases that are each designed to interface and/or make physical contact with an optical transceiver installed in a line card. The flexibility and independence of the heat pipes may enable them to move in opposing directions to accommodate the installation and/or removal of the optical transceivers.

Unfortunately, traditional isolated heatsinks may be unable to disperse and/or dissipate enough heat to enable some optical transceivers to function properly. For example, while a traditional isolated heatsink may be able to dissipate enough heat for a 100-gigabit optical transceiver, this traditional isolated heatsink may be incapable of dissipating enough heat for a 400-gigabit optical transceiver. However, a ganged heat exchanger may increase the amount of heat dispersed and/or dissipated from those optical modules. As a result, this ganged heat exchanger may be able to sink and/or transfer away enough heat to keep those optical transceivers operating at acceptable temperatures, thereby enabling those optical transceivers to function properly and/or optimally.

This ganged heat exchanger may not simply be added across a set of traditional isolated heatsinks though because doing so would eliminate the heatsinks' independent movement and/or ability to accommodate the installation and/or removal of individual optical transceivers. Accordingly, embodiments of the instant disclosure may be able to increase the amount of heat transferred and/or dissipated from certain optical transceivers (e.g., 400-gigabit optical transceivers) without compromising the ability to install and/or remove individual optical transceivers.

The following will provide, with reference to FIGS. 1-7, detailed descriptions of an exemplary apparatuses and corresponding implementations and configurations for dissipating heat emitted by individual communication modules via ganged heat exchangers. In addition, the discussion corresponding to FIG. 8 will provide a detailed description of an exemplary method for dissipating heat emitted by individual communication modules via ganged heat exchangers.

Figure 2:
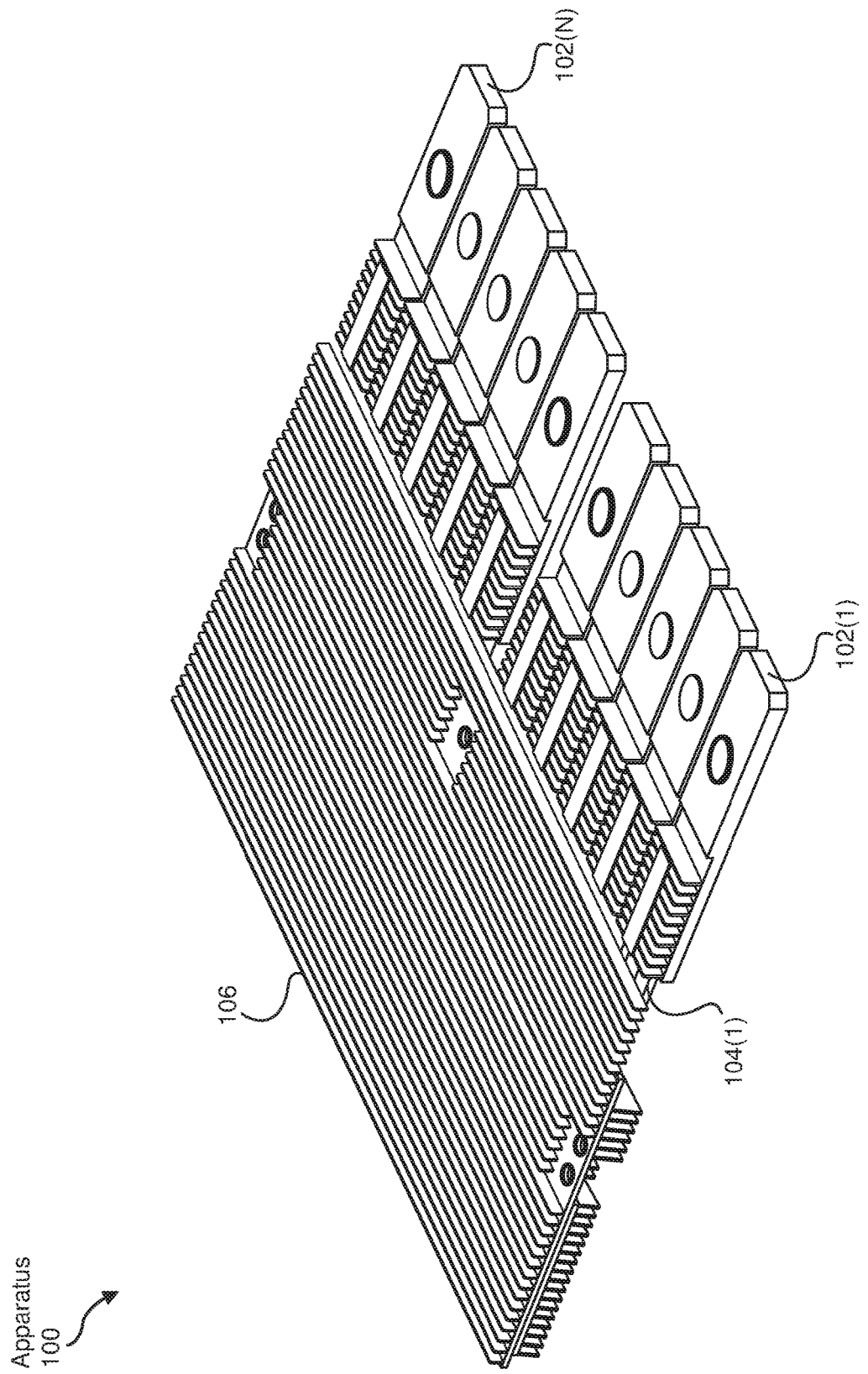
FIG. 2 is an illustration of an exemplary apparatus for dissipating heat emitted by individual communication modules via ganged heat exchangers.
Figure 3:
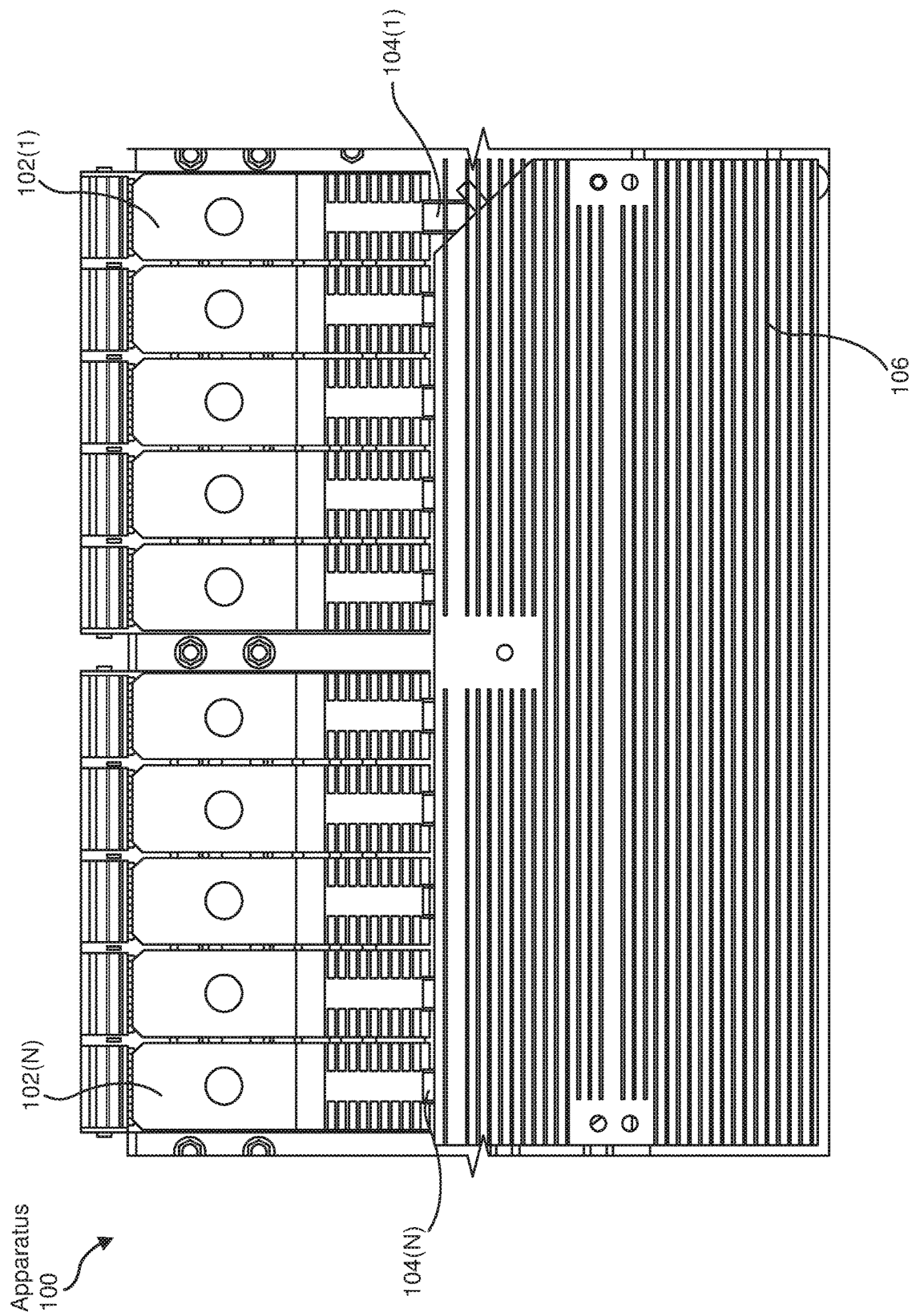
FIG. 3 is an illustration of an exemplary apparatus for dissipating heat emitted by individual communication modules via ganged heat exchangers.

FIGS. 1-3 illustrate different views and/or perspectives of an exemplary apparatus 100 for dissipating heat emitted by individual communication modules via ganged heat exchangers. As illustrated in FIGS. 1-3, exemplary apparatus 100 may include and/or represent heatsink bases 102(1)-(N), heat pipes 104(1)-(N), and a ganged heat exchanger 106. In some examples, apparatus 100 may be installed and/or applied to a line card within a telecommunications device (such as a router).

Heatsink bases 102(1)-(N) each generally represent any device, structure, and/or mechanism that conducts, transfers, absorbs, and/or sinks heat. Heatsink bases 102(1)-(N) may each be designed for the specific purpose of conducting, transferring, absorbing, and/or sinking heat generated and/or emitted by an individual communication module (such as an optical transceiver). In one example, heatsink bases 102(1)-(N) may be physically, mechanically, and/or thermally coupled to heat pipes 104(1)-(N), respectively. In this example, heatsink bases 102(1)-(N) be able to move independently of one another in opposing directions (e.g., up and down) to accommodate the installation and/or removal of the individual communication modules.

Heatsink bases 102(1)-(N) may be of various shapes and/or dimensions. In some examples, heatsink bases 102(1)-(N) may each form a square, a rectangle, and/or a cuboid. Additional examples of shapes formed by heatsink bases 102(1)-(N) include, without limitation, ovals, circles, triangles, diamonds, parallelograms, variations or combinations of one or more of the same, and/or any other suitable shapes. In one example, heatsink bases 102(1)-(N) may include and/or incorporate a finned and/or pin fin configuration or design.

In some examples, heatsink bases 102(1)-(N) may be sized in a particular way to maximize the amount of heat transferred from the individual communication modules. In one example, heatsink bases 102(1)-(N) may each run the length of one side of the corresponding communication modules or beyond. Heatsink bases 102(1)-(N) may each include a pedestal that makes physical contact with the corresponding optical module for the purpose of absorbing heat generated and/or emitted by that communication module.

Heatsink bases 102(1)-(N) may include and/or contain a variety of materials. Examples of such heatsink materials include, without limitation, copper, aluminum, diamond, alloys of one or more of the same, combinations or variations of one or more of the same, and/or any other suitable materials.

Heat pipes 104(1)-(N) each generally represent a heat-transfer device that combines and/or accounts for principles of thermal conductivity and phase transition to support heat transfer between solid structures. Heat pipes 104(1)-(N) may each be designed for the specific purpose of transferring heat from heatsink bases 102(1)-(N). In one example, heat pipes 104(1)-(N) may be physically, mechanically, and/or thermally coupled to heatsink bases 102(1)-(N), respectively. In addition, heat pipes 104(1)-(N) may be physically, mechanically, and/or thermally coupled to ganged heat exchanger 106. Accordingly, one end of each heat pipe may be coupled to one of heatsink bases 102(1)-(N), and the other end of each heat pipe may be coupled to ganged heat exchanger 106.

Heat pipes 104(1)-(N) may be of various shapes and/or dimensions. In some examples, heat pipes 104(1)-(N) may each form a cylinder, a tube, and/or a cuboid. Additional examples of shapes formed by heat pipes 104(1)-(N) include, without limitation, ovals, circles, triangles, diamonds, parallelograms, variations or combinations of one or more of the same, and/or any other suitable shapes.

In some examples, heat pipes 104(1)-(N) may be sized in a particular way to maximize the amount of heat transferred from heatsink bases 102(1)-(N) to ganged heat exchanger 106. Heat pipes 104(1)-(N) may include and/or contain a variety of materials. Examples of such heatsink materials include, without limitation, copper, aluminum, diamond, alloys of one or more of the same, combinations or variations of one or more of the same, and/or any other suitable materials. In addition, heat pipes 104(1)-(N) may include and/or represent bendable, flexible, and/or malleable material that facilitates bending, flexing, and/or moving heatsink bases 102(1)-(N), respectively, to accommodate installing individual communication modules into and/or removing individual communication from the line card of the telecommunications device. Additionally or alternatively, heat pipes 104(1)-(N) may each pivot from a hinge and/or joint at ganged heat exchanger 106 to facilitate the movement of heatsink bases 102(1)-(N) and/or accommodate installing individual communication modules into and/or removing individual communication from the line card of the telecommunications device.

Ganged heat exchanger 106 generally represents a heatsink and/or heat exchanger that disperses and/or dissipates heat emitted by multiple electronic components simultaneously. In some examples, ganged heat exchanger 106 may include and/or represent a vapor chamber that disperses and/or dissipates heat emitted by various individual communication modules installed in the line card of the telecommunications device. This vapor chamber may amount to a thin and/or planar heat-transfer device that forms an airtight vessel. Inside the airtight vessel, the vapor chamber may hold some form of liquid (such as water, methanol, and/or acetone) that serves as a coolant. In one example, the vapor chamber may combine and/or account for principles of thermal conductivity and phase transition to support heat transfer between solid structures.

In some examples, these individual communication modules may consume differing amounts of power and/or produce differing amounts of heat. Accordingly, ganged heat exchanger 106 may spread, disperse, and/or dissipate disproportionate amounts of heat for the various communication modules. In other words, the temperature of ganged heat exchanger 106 may be influenced and/or dictated more by some of the communication modules than others.

Ganged heat exchanger 106 may be of various shapes and/or dimensions. In some examples, ganged heat exchanger 106 may each form a square, a rectangle, and/or a cuboid. Additional examples of shapes formed by ganged heat exchanger 106 include, without limitation, ovals, circles, triangles, diamonds, parallelograms, variations or combinations of one or more of the same, and/or any other suitable shapes. In some examples, ganged heat exchanger 106 may include and/or incorporate a finned and/or pin fin configuration or design.

In some examples, ganged heat exchanger 106 may be sized in a particular way to maximize the amount of heat dispersed and/or dissipated from the individual communication modules. Ganged heat exchanger 106 may include and/or contain a variety of materials. Examples of such heatsink materials include, without limitation, copper, aluminum, diamond, alloys done or more of the same, combinations or variations alone or more of the same, and/or any other suitable materials.

As illustrated in FIGS. 1-3, individual heatsink bases 102(1)-(N) may be designed to interface with removable communication modules (such as optical transceivers) installed on the telecommunications device. Heat pipes 104(1)-(N) may be thermally coupled to individual heatsink bases 102(1)-(N). Ganged heat exchanger 106 may be mechanically coupled to the telecommunications device and thermally coupled to heat pipes 104(1)-(N).

In one example, heat pipes 104(1)-(N) may be flexible and/or bendable. As a result of their flexibility and/or bendability, heat pipes 104(1)-(N) may be able to move independently of one another in opposing directions. For example, heat pipes 104(1)-(N) may move up and/or down to accommodate and/or facilitate installing and removing the communication modules.

In some examples, ganged heat exchanger 106 may include and/or represent a vapor chamber that dissipates heat emitted by the removable communication modules installed on the telecommunications device. In one example, ganged heat exchanger 106 may have and/or include a surface area that is at least three times larger than the surface area of each individual heatsink base.

In some examples, the removable communication modules may include and/or represent optical modules of varying speeds. In one example, these removable communication modules may include a 100-gigabit optical module and a high-speed 400-gigabit optical module. In this example, one of individual heatsink bases 102(1)-(N) may interface with the 100-gigabit optical module, and another one of individual heatsink bases 102(1)-(N) may interface with the 400-gigabit optical module.

In some examples, ganged heat exchanger 106 may dissipate more heat that originated from one removable communication module than another. For example, the high-speed 400-gigabit optical modules may generate and/or emit much more heat than the 100-gigabit optical modules. In this example, ganged heat exchanger 106 may spread, disperse, and/or dissipate a greater amount of heat that originated from the high-speed 400 gigabit optical module than the 100-gigabit optical module.

In some examples, the removable communication modules may be installed into a line card that has certain power and/or bandwidth limitations. For example, a line card may include and/or provide five individual ports for removable communication modules. In this example, the line card may house and/or facilitate the simultaneous functionality of five individual 100-gigabit optical modules. However, this line card may be unable to house and/or facilitate the simultaneous functionality of one 400-gigabit optical module and four 100-gigabit optical modules.

In this example, the line card may be limited to providing power to line cards that collectively facilitate approximately 700 gigabits of traffic. Additionally or alternatively, this line card may be limited to servicing a total of 700 gigabits of traffic simultaneously. As a result, in the event that a 400-gigabit optical module is installed into one port of this line card, at least one of the four remaining ports of this line card must remain empty, open, and/or unused. In this configuration, the line card may be able to house and/or facilitate the functionality of the 400-gigabit optical module and up to three additional 100-gigabit optical modules simultaneously. As result, the individual heatsink base that corresponds to the empty port of the line card may remain disengaged such that the individual heatsink base does not interface with any of the removable communication modules.

In some examples, individual heatsink bases 102(1)-(N) may be pressurized by springs that force individual heatsink bases 102(1)-(N) to press down against the removable communication modules. The forces applied by these springs may reinforce individual heatsink bases 102(1)-(N) to ensure that individual heatsink bases 102(1)-(N) maintain secure thermal couplings with the removable communication modules installed in the line card of the telecommunications device.

In some examples, ganged heat exchanger 106 may include and/or represent multiple components that serve to dissipate heat emitted by the removable communication modules. For example, ganged heat exchanger 106 may include a top heat exchanger that is thermally coupled to a top side of each of heat pipes 104(1)-(N) and a bottom heat exchanger that is thermally coupled to a bottom side of each of heat pipes 104(1)-(N). The combination of top heat exchanger and bottom heat exchanger may effectively expand the surface area of ganged heat exchanger 106 to increase the potential for heat dissipation.

In some examples, the line card may house the removable communication modules within the telecommunications device. In one example, ganged heat exchanger 106 may be mechanically coupled (by way of, e.g., one or more screws) to the line card within the telecommunications device.

Figure 4:
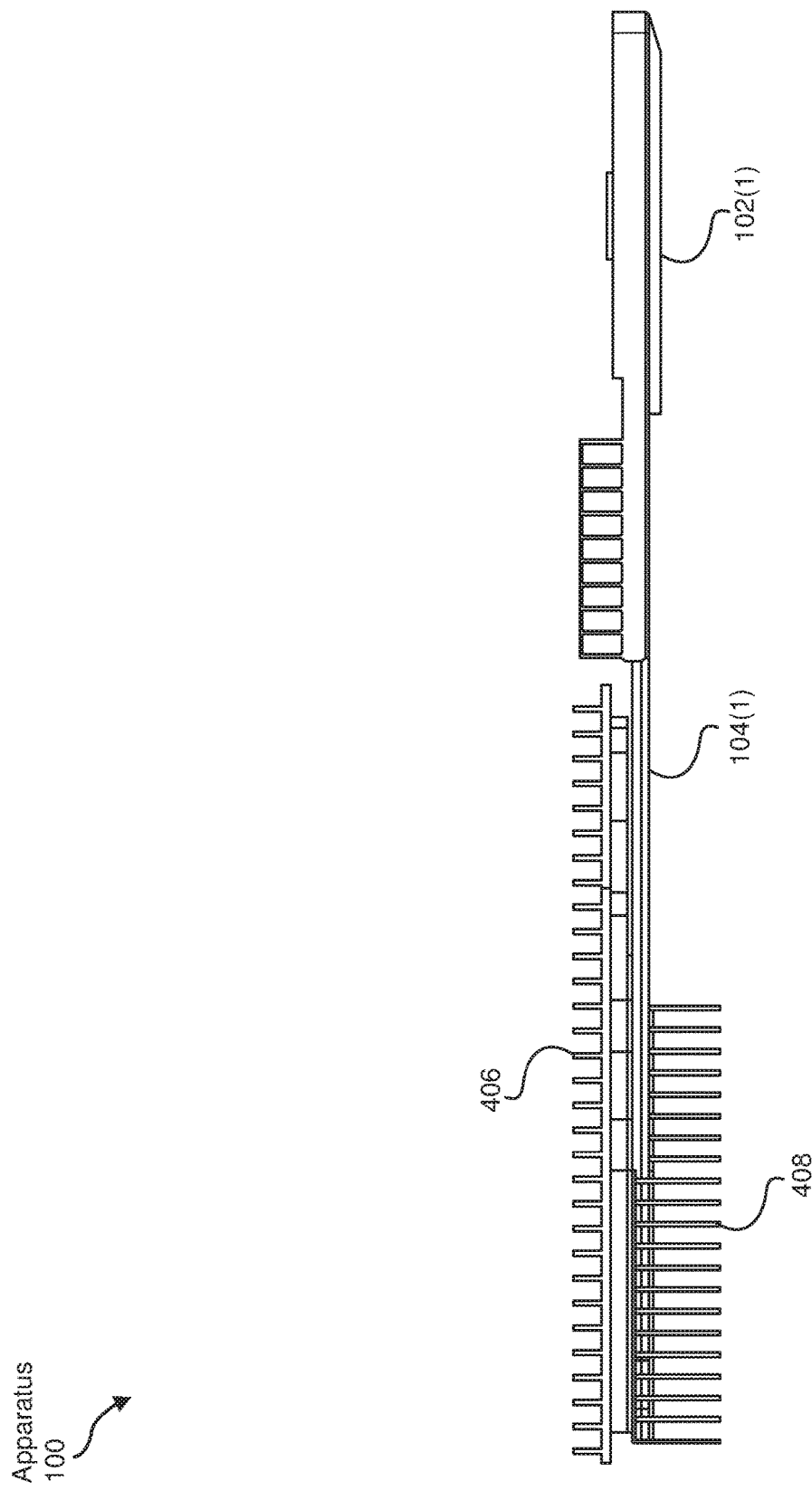
FIG. 4 is an illustration of an exemplary apparatus for dissipating heat emitted by individual communication modules via ganged heat exchangers.

FIG. 4 illustrates a side view of exemplary apparatus 100 for dissipating heat emitted by individual communication modules via ganged heat exchangers. As illustrated in FIG.

4, exemplary apparatus 100 may include and/or represent heatsink base 102(1), heat pipe 104(1), and a ganged heat exchanger that includes a top piece 406 and a bottom piece 408. Exemplary apparatus 100 in FIG. 4 may also include and/or represent various other components (e.g., additional heatsink bases and/or additional heat pipes) that are obscured by the side view illustrated in FIG. 4. In some examples, top piece 406 may include and/or represent a vapor chamber. Additionally or alternatively, bottom piece 408 may include and/or represent another vapor chamber.

Figure 5:
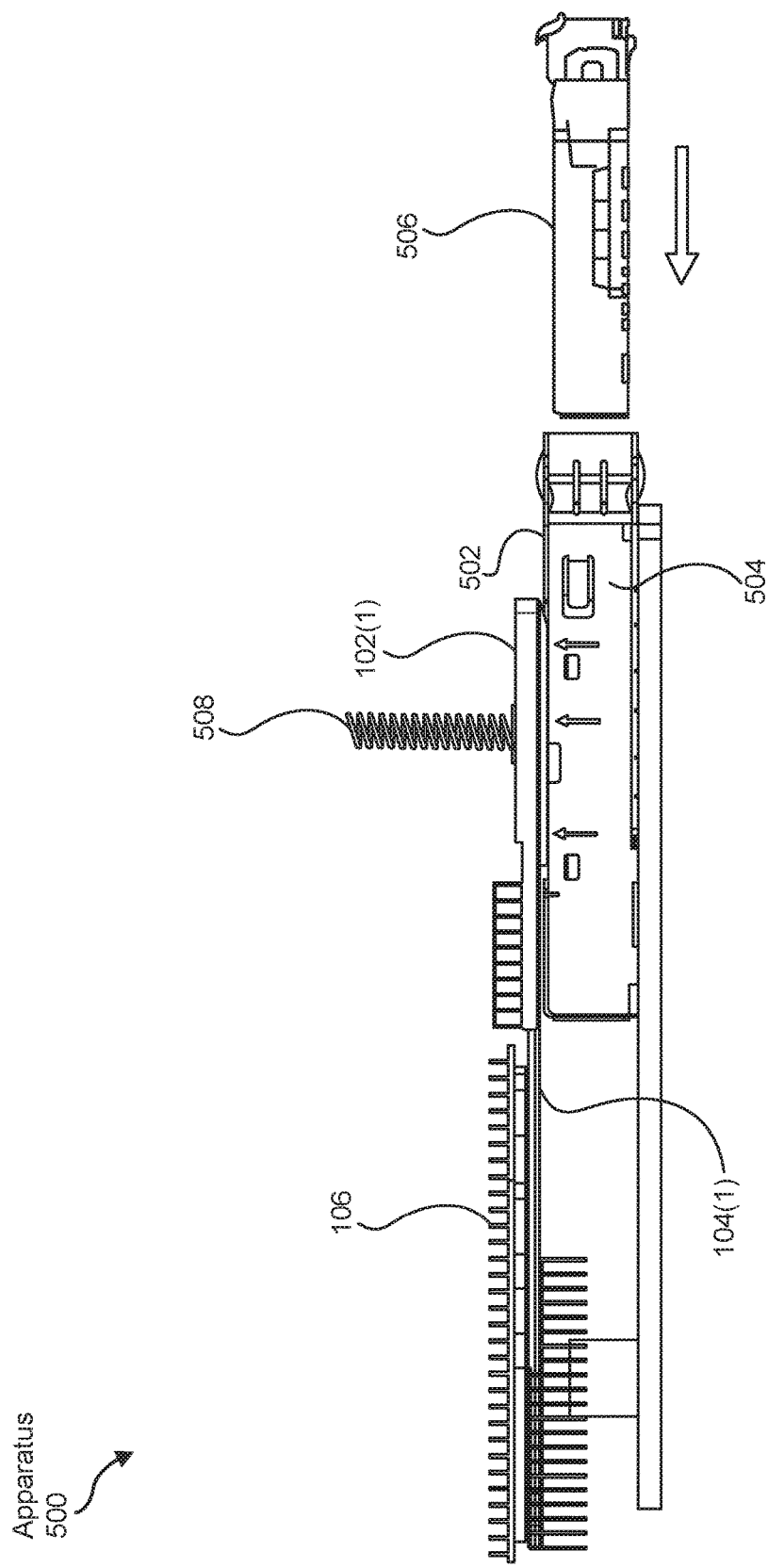
FIG. 5 is an illustration of an exemplary apparatus for dissipating heat emitted by individual communication modules via ganged heat exchangers.

FIG. 5 illustrates a side view of an exemplary apparatus 500 for dissipating heat emitted by individual communication modules via ganged heat exchangers. As illustrated in FIG. 5, exemplary apparatus 500 may include and/or represent heatsink base 102(1), heat pipe 104(1), and ganged heat exchanger 106. In addition, exemplary apparatus 500 may include and/or represent a line card 502 that includes one or more ports, such as port 504. Like apparatus 100 in FIG. 4, exemplary apparatus 500 may also include and/or represent various other components (e.g., additional heatsink bases, additional heat pipes, and/or additional ports) that are obscured by the side view illustrated in FIG. 5. In one example, port 504 may be designed to house a removable communication module 506 (such as an optical transceiver) that forwards traffic from one device to another within a network and/or across networks.

As illustrated in FIG. 5, heatsink base 102(1) may be pressed down toward line card 502 and/or port 504. For example, a spring 508 (such as a coil and/or compression spring) may apply a downward force onto heatsink base 102(1) within a telecommunications device. Although not illustrated in this way in FIG. 5, springs may be compressed and/or pressurized atop each heatsink base included in apparatus 500. In one example, line card 502 may include and/or form an opening that allows and/or enables heatsink base 102(1) to make physical contact and/or thermally couple with removable communication module 506 upon installation and/or insertion into port 504 of line card 502. As removable communication module 506 is installed and/or inserted into port 504, removable communication module 506 may lift up, push up, and/or raise heatsink base 102(1), thereby forming a thermal coupling between removable communication module 506 and heatsink base 102(1).

Figure 6:
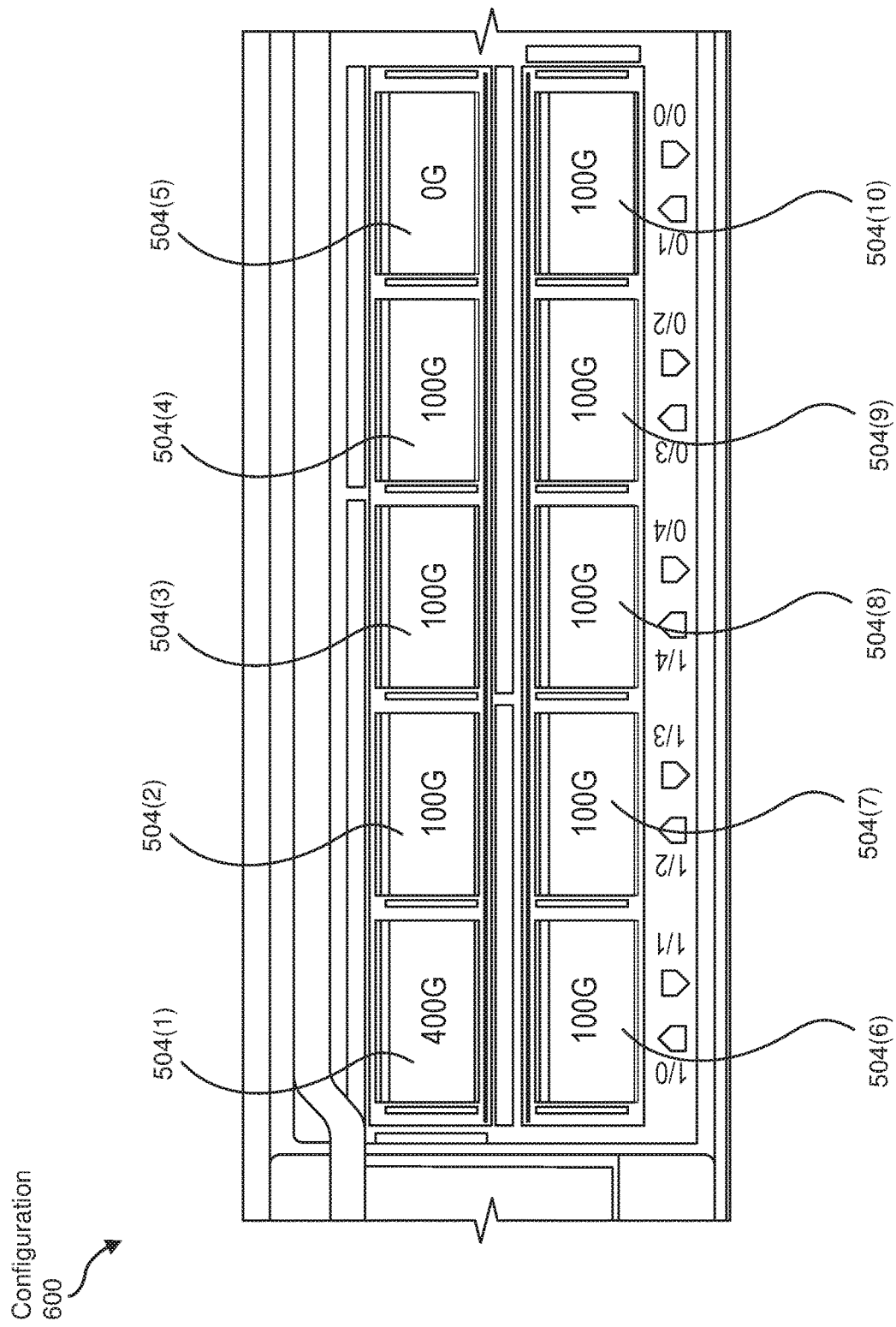
FIG. 6 is an illustration of an exemplary configuration of removable communication modules installed in a line cards of a telecommunications device.

FIG. 6 illustrates an exemplary configuration 600 of optical transceivers that are installed into a line card of a telecommunications device. As illustrated in FIG. 6, configuration 600 may show and/or represent a first row of ports 504(1), 504(2), 504(3), 504(4), and 504(5) included on the line card. Configuration 600 may show and/or represent a second row of ports 504(6), 504(7), 504(8), 504(9), and 504(10) included on the line card.

In some examples, the line card may have certain power and/or bandwidth limitations that prevent installation of too many high-speed 400-gigabit optical transceivers. For example, the line card represented in FIG. 6 may include and/or provide ten individual ports for optical transceivers. In this example, the line card may house and/or facilitate the simultaneous functionality of 10 individual 100-gigabit optical transceivers. However, this line card may be unable to house and/or facilitate the simultaneous functionality of one 400-gigabit optical transceiver and nine 100-gigabit optical transceivers.

In this example, the line card may be limited to providing power to line cards that collectively facilitate approximately 1200 gigabits of traffic. Additionally or alternatively, this line card may be limited to servicing a total of 1200 gigabits of traffic simultaneously. As a result, in the event that a 400-gigabit optical transceiver is installed into port 504(1) of this line card, at least one of the nine remaining ports of this line card must remain empty, open, and/or unused. For example, port 504(5) of this line card may be left empty, open, and/or unused while ports 504(2)-(4) and 504(6)-(10) of this line card each house a 100-gigabit optical transceiver. In configuration 600, the line card may be able to house and/or facilitate the functionality of the one 400-gigabit optical module and eight 100-gigabit optical modules simultaneously.

Figure 7:
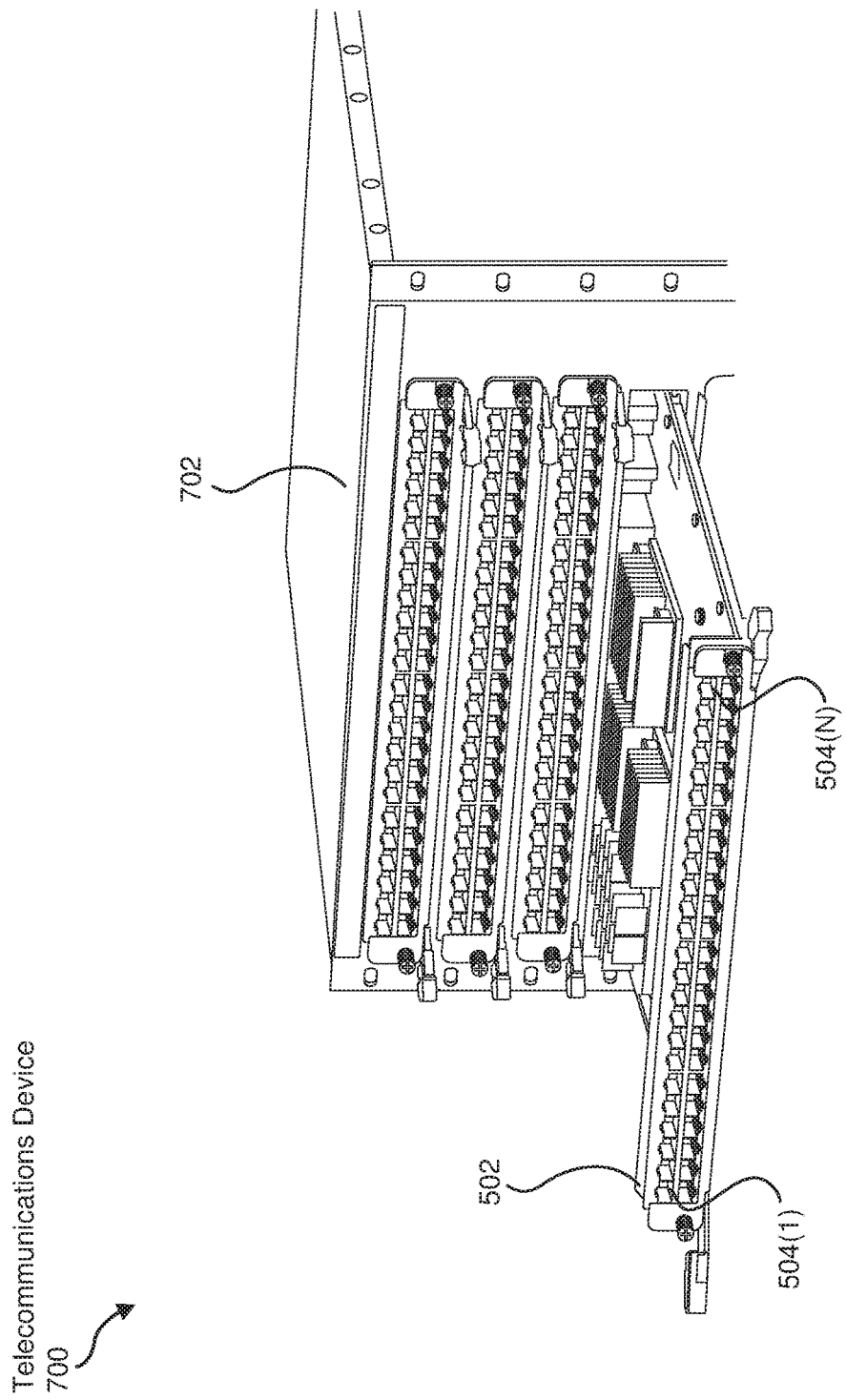
FIG. 7 is an illustration of an exemplary telecommunications device that incorporates an apparatus for dissipating heat emitted by individual communication modules via ganged heat exchangers.

FIG. 7 illustrates an exemplary telecommunications device 700 that incorporates apparatus 100 in FIGS. 1-4. As illustrated in FIG. 7, telecommunications device 700 may include one or more line cards, such as line card 502. In this example, line card 502 may include various ports, such as ports 504(1)-(N), that house removable communications modules. Although not illustrated in FIG. 7, apparatus 100 may be incorporated into telecommunications device 700 and may dissipate heat emitted by removable communication modules installed in at least some of ports 504(1)-(N).

Figure 8:
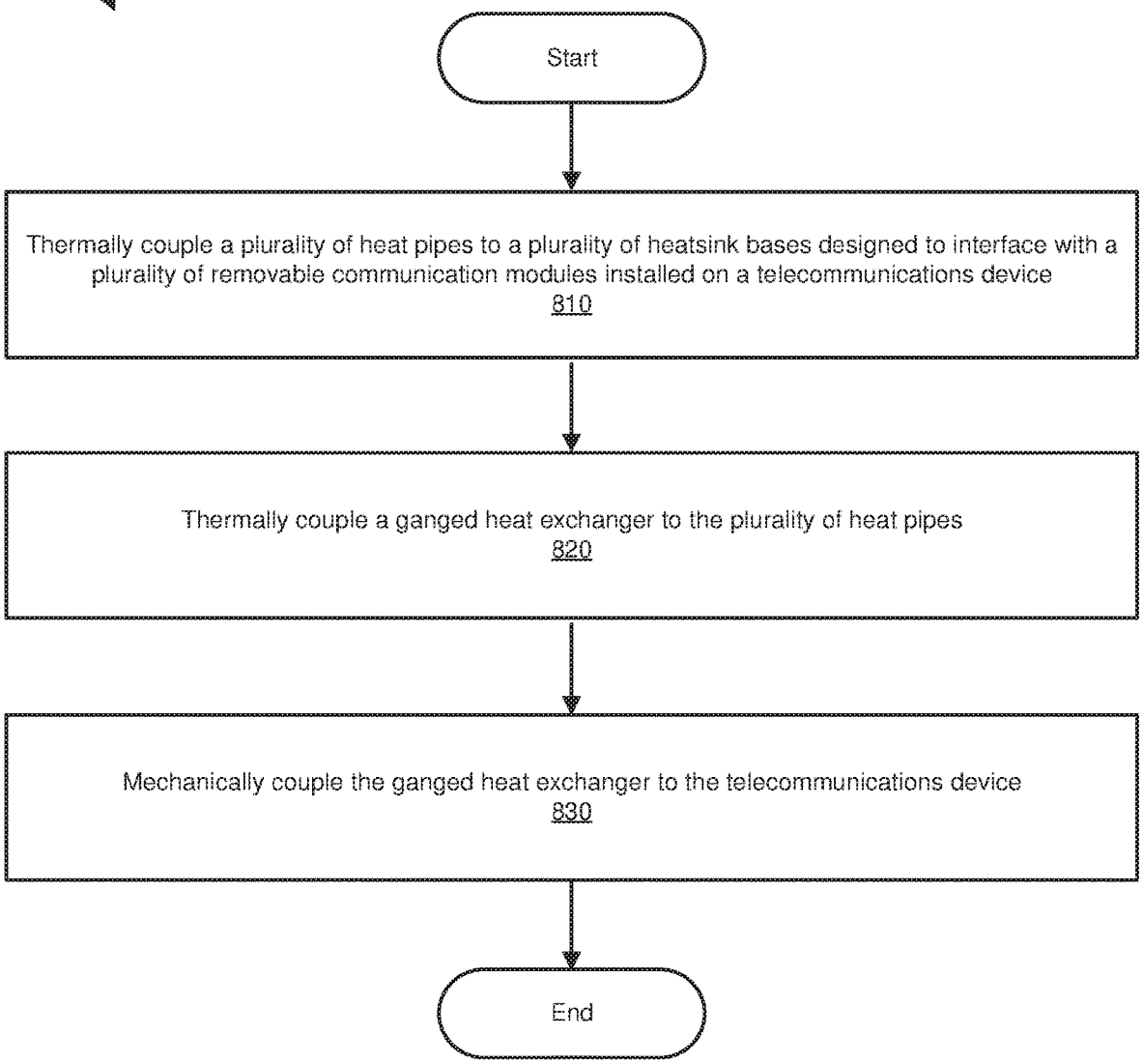
FIG. 8 is a flow diagram of an exemplary method for dissipating heat emitted by individual communication modules via ganged heat exchangers.

FIG. 8 is a flow diagram of an exemplary method 800 for dissipating heat emitted by individual communication modules via ganged heat exchangers. Method 800 may include the step of thermally coupling a plurality of heat pipes to a plurality of heatsink bases designed to interface with a plurality of removable communication modules installed on a telecommunications device (810). Step 810 may be performed in a variety of ways, including any of those described above in connection with FIGS. 1-7. For example, a computing equipment manufacturer or subcontractor may thermally couple a plurality of heat pipes to a plurality of heatsink bases. In this example, the heatsink bases may be designed to interface with a plurality of removable communication modules installed on a telecommunications device.

Method 800 may also include the step of thermally coupling a ganged heat exchanger to the plurality of heat pipes (820). Step 820 may be performed in a variety of ways, including any of those described above in connection with FIGS. 1-7. For example, the computing equipment manufacturer or subcontractor may thermally couple a ganged heat exchanger to the plurality of heat pipes. In one example, this ganged heat exchanger may be a vapor chamber that dissipates disproportionate amounts of heat generated by the removable communication modules installed on the telecommunication device.

Method 800 may further include the step of mechanically coupling the ganged heat exchanger to the telecommunications device (830). Step 830 may be performed in a variety of ways, including any of those described above in connection with FIGS. 1-7. For example, the computing equipment manufacturer or subcontractor may mechanically couple the ganged heat exchanger atop a line card of the telecommunications device. In this example, the telecommunications device may include and/or represent a router or switch that facilitates the flow of traffic within a network and/or across networks.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A telecommunications device comprising:
   a plurality of at least three ports, each of the ports configured for interfacing with an individual one of a plurality of removable communication modules, each of the removable communication modules selected from a group consisting of a low-speed optical module and a high-speed optical module, the high-speed optical module is substantially four times faster than each of the low-speed optical module; and
   a thermal apparatus comprising:
      a plurality of individual heatsink bases, each of individual heatsink bases configured for interfacing with the individual one of the removable communication modules when the individual one of the removable communication modules is installed in an individual one of the ports;
      a plurality of heat pipes, a first end of each of the heat pipes thermally coupled to an individual one of the individual heatsink bases; and
      a ganged heat exchanger that is:
         mechanically coupled to the telecommunications device; and
         thermally coupled to a second end of each of the heat pipes;
   wherein when each of the ports is occupied with an individual one of the low-speed optical module, the telecommunications device is capable of facilitating simultaneous functionality of each of the low-speed optical module, and
   wherein when a first one of the ports is occupied with the high-speed optical module and at least a second one of the ports is occupied with the individual one of the of the low-speed optical module, the telecommunications device is capable of facilitating simultaneous functionality of each of the removable communication modules provided that another one of the ports is unoccupied by any of the removable communication modules.

2. The telecommunications device of claim 1, wherein the heat pipes:
   are flexible; and
   enable the individual heatsink bases to move independently of one another in opposing directions to accommodate installation and removal of the removable communication modules.

3. The telecommunications device of claim 1, wherein the ganged heat exchanger comprises a vapor chamber that dissipates heat emitted by the removable communication modules installed on the telecommunications device.

4. The telecommunications device of claim 1, wherein the ganged heat exchanger includes a surface area that is at least three times larger than a surface area of each of the individual heatsink bases.

5. The telecommunications device of claim 1, wherein the ganged heat exchanger:
   dissipates a first amount of heat that originated from the individual one of the low-speed optical modules; and
   dissipates a second amount of heat that originated from the high-speed optical module, wherein the second amount of heat is greater than the first amount of heat.

6. An apparatus comprising:
   a plurality of at least three ports, each of the ports configured for interfacing with an individual one of a plurality of removable communication modules, each of the removable communication modules selected from a group consisting of a low-speed optical module and a high-speed optical module, the high-speed optical module is substantially four times faster than each of the low-speed optical module; and
   a thermal apparatus comprising:
      a plurality of individual heatsink bases, each of individual heatsink bases configured for interfacing with the individual one of the removable communication modules when the individual one of the removable communication modules is installed in an individual one of the ports;
      a plurality of heat pipes, a first end of each of the heat pipes thermally coupled to an individual one of the individual heatsink bases; and
      a ganged heat exchanger that is:
         mechanically coupled to a telecommunications device; and
         thermally coupled to a second end of each of the heat pipes;
   wherein when each of the ports is occupied with an individual one of the low-speed optical module, the telecommunications device is capable of facilitating simultaneous functionality of each of the low-speed optical module, and
   wherein when a first one of the ports is occupied with the high-speed optical module and at least a second one of the ports is occupied with the individual one of the of the low-speed optical module, the telecommunications device is capable of facilitating simultaneous functionality of each of the removable communication modules provided that another one of the ports is unoccupied by any of the removable communication modules.

7. The apparatus of claim 6, wherein the heat pipes:
   are flexible; and
   enable the individual heatsink bases to move independently of one another in opposing directions to accommodate installation and removal of the removable communication modules.

8. The apparatus of claim 6, wherein the ganged heat exchanger comprises a vapor chamber that dissipates heat emitted by the removable communication modules installed on the telecommunications device.

9. The apparatus of claim 6, wherein the ganged heat exchanger includes a surface area that is at least three times larger than a surface area of each of the individual heatsink bases.

10. The apparatus of claim 6, wherein the ganged heat exchanger:
dissipates a first amount of heat that originated from the individual one of the low-speed optical modules; and
dissipates a second amount of heat that originated from the high-speed optical module, wherein the second amount of heat is greater than the first amount of heat.

11. The apparatus of claim 6, further comprising a plurality of springs that are mechanically coupled to the individual heatsink bases, wherein each of the springs applies a force that presses the individual one of the individual heatsink bases against the individual one of the removable communication modules.

12. The apparatus of claim 6, wherein the ganged heat exchanger comprises:
a top heat exchanger that is thermally coupled to a top side of each of the heat pipes; and
a bottom heat exchanger that is thermally coupled to a bottom side of each of the heat pipes.

13. The apparatus of claim 6, further comprising a line card that houses the removable communication modules within the telecommunications device; and
wherein the ganged heat exchanger is mechanically coupled to the line card within the telecommunications device.

14. A method comprising:
thermally coupling a plurality of heat pipes to a plurality of individual heatsink bases, each of the individual heatsink bases configured for interfacing with an individual one of a plurality of removable communication modules, each of the removable communication modules selected from a group consisting of a low-speed optical module and a high-speed optical module, the high-speed optical module is substantially four times faster than each of the low-speed optical modules;
thermally coupling a ganged heat exchanger to the plurality of heat pipes;
mechanically coupling the ganged heat exchanger to a telecommunications device;
installing the high-speed optical module into a first one of a set of ports on a line card of the telecommunications device such that the high-speed optical module interfaces with a first one of the individual heatsink bases;
leaving a second one of the ports on the line card of the telecommunications device empty such that a second one of the individual heatsink bases is disengaged and does not interface with any of the removable communication modules,
installing the low-speed optical module into each of at least one remaining one of the ports on the line card of the telecommunications device such that each of the low-speed optical module interfaces with a remaining one of the individual heatsink bases; and
operating the telecommunications device, the telecommunications device being configured to facilitate simultaneous functionality of each of the removable communication modules due at least in part to the second one of the ports being empty.

15. The method of claim 14, further comprises:
removing the high-speed optical module from the first one of the ports on the line card of the telecommunications device;
installing a first additional one of the low-speed optical module into the first one of the ports on the line card of the telecommunications device such that the first additional one of the low-speed optical module interfaces with the first one of the individual heatsink bases;
installing a second additional one of the low-speed optical module into the second one of the ports on the line card of the telecommunications device such that the second additional one of the low-speed optical module in the second one of the ports interfaces with the second one of the individual heatsink bases; and
operating the telecommunications device, the telecommunications device being configured to facilitate simultaneous functionality of each of the removable communication modules due at least in part that each of the removable communication modules being only the low-speed optical module.

* * * * *